US010090191B2

United States Patent
Tomura et al.

(10) Patent No.: US 10,090,191 B2
(45) Date of Patent: Oct. 2, 2018

(54) SELECTIVE PLASMA ETCHING METHOD OF A FIRST REGION CONTAINING A SILICON ATOM AND AN OXYGEN ATOM

(71) Applicant: Tokyo Electron Limited, Tokyo (JP)

(72) Inventors: Maju Tomura, Miyagi (JP); Takayuki Katsunuma, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/527,360

(22) PCT Filed: Nov. 20, 2015

(86) PCT No.: PCT/JP2015/082646
§ 371 (c)(1),
(2) Date: May 17, 2017

(87) PCT Pub. No.: WO2016/088575
PCT Pub. Date: Jun. 9, 2016

(65) Prior Publication Data
US 2017/0323825 A1    Nov. 9, 2017

(30) Foreign Application Priority Data

Dec. 5, 2014    (JP) .................................. 2014-246745

(51) Int. Cl.
*H01L 21/768* (2006.01)
*H01L 21/311* (2006.01)
(Continued)

(52) U.S. Cl.
CPC .. *H01L 21/76802* (2013.01); *H01L 21/31116* (2013.01); *H01L 21/31144* (2013.01); *H01L 23/535* (2013.01); *H01J 37/321* (2013.01)

(58) Field of Classification Search
CPC ......... H01L 21/31144; H01L 21/31116; H01L 21/76802; H01L 23/535; H01J 37/321
See application file for complete search history.

(56) References Cited

U.S. PATENT DOCUMENTS 5,942,446 A * 8/1999 Chen ................ H01L 21/31116
216/67
6,617,253 B1 * 9/2003 Chu ................. H01L 21/76802
257/E21.252
(Continued)

FOREIGN PATENT DOCUMENTS

JP    06-283480 A    10/1994
JP    10-242130 A    9/1998
(Continued)

OTHER PUBLICATIONS

International Search Report for PCT/JP2015/082646 dated Feb. 9, 2016.

*Primary Examiner* — Kenneth Parker
*Assistant Examiner* — Nilufa Rahim
(74) *Attorney, Agent, or Firm* — Pearne & Gordon LLP

(57) ABSTRACT

A method includes performing one or more times of a sequence and reducing a film thickness of a fluorocarbon-containing film formed by performing one or more times of the sequence. Each of the one or more times of the sequence includes forming the fluorocarbon-containing film on a processing target object by generating plasma of a processing gas containing a fluorocarbon gas and not containing an oxygen gas; and etching a first region with radicals of fluorocarbon contained in the fluorocarbon-containing film. In the method, an alternating repetition in which the one or more times of the sequence and the reducing of the film thickness of the fluorocarbon-containing film are alternately repeated is performed.

20 Claims, 10 Drawing Sheets

(51) Int. Cl.
*H01L 23/535* (2006.01)
*H01J 37/32* (2006.01)

(56) References Cited

U.S. PATENT DOCUMENTS

| | | | |
|---|---|---|---|
| 7,708,859 B2 | 5/2010 | Huang | |
| 2005/0284576 A1* | 12/2005 | America | ............... B08B 7/0035 |
| | | | 156/345.43 |
| 2016/0079107 A1* | 3/2016 | Aramaki | ............. H01L 21/6833 |
| | | | 156/345.51 |

FOREIGN PATENT DOCUMENTS

| | | |
|---|---|---|
| JP | 2000-307001 A | 11/2000 |
| JP | 2003-151956 A | 5/2003 |
| JP | 2007-027349 A | 2/2007 |
| JP | 2010-062587 A | 3/2010 |

* cited by examiner

SELECTIVE PLASMA ETCHING METHOD OF A FIRST REGION CONTAINING A SILICON ATOM AND AN OXYGEN ATOM

CROSS-REFERENCE TO RELATED APPLICATION

This Application is a U.S. national phase application under 35 U.S.C. § 371 of PCT Application No. PCT/JP2015/082646 filed on Nov. 20, 2015, which claims the benefit of Japanese Patent Application No. 2014-246745 filed on Dec. 5, 2014, the entire disclosures of which are incorporated herein by reference.

TECHNICAL FIELD

The various embodiments described herein pertain generally to an etching method; and, more particularly, to a method of etching a first region containing a silicon atom and an oxygen atom selectively with respect to a second region made of a material different from the first region by performing a plasma processing on a processing target object.

BACKGROUND ART

In the manufacture of an electronic device, a processing of forming an opening such as a hole or a trench in a region containing a silicon atom and an oxygen atom, for example, a region made of silicon oxide ($SiO_2$) may be performed. Generally, in such a processing, the corresponding region is etched by exposing the processing target object to plasma of a fluorocarbon gas, as described in U.S. Pat. No. 7,708,859.

Further, there is known a technique of etching a first region containing a silicon atom and an oxygen atom, for example, a first region made of silicon oxide selectively with respect to a second region made of a material different from the first region. As an example of such technique, a SAC (Self-Aligned Contact) technique is known. This SAC technique is described in Japanese Patent Laid-open Publication No. 2000-307001.

A processing target object to be processed by the SAC technique has a first region made of silicon oxide, a second region made of silicon nitride and a mask. The second region is provided to form a recess therein, and the first region is provided to fill the recess and cover the second region. The mask is provided on the first region and is provided with an opening above the recess. In the conventional SAC technique, plasma of a processing gas containing a fluorocarbon gas, an oxygen gas and a rare gas is used to etch the first region, as described in Japanese Patent Laid-open Publication No. 2000-307001. By exposing the processing target object to the plasma of this processing gas, a portion of the first region exposed through the opening of the mask is etched, so that an upper opening is formed. Further, as the processing target object is exposed to the plasma of the processing gas, a portion of the first region embedded in the second region is etched in a self-aligned manner. Accordingly, a lower opening continuous to the upper opening is formed in the self-aligned way.

Patent Document 1: U.S. Pat. No. 7,708,859
Patent Document 2: Japanese Patent Laid-open Publication No. 2000-307001

DISCLOSURE OF THE INVENTION

Problems to be Solved by the Invention

In the above-stated prior art, however, the second region may suffer undesired cutting during the etching of the first region. If a condition in which a large amount of fluorocarbon is deposited on the second region is selected to suppress this cutting, a width of the opening (the upper opening and/or the lower opening) may be narrowed by a fluorocarbon-containing film, and the opening may be even blocked. That is, suppression of the cutting of the second region by the fluorocarbon-containing film and suppression of the reduction of the opening width due to the fluorocarbon-containing film are in a trade-off relation, and it has been difficult to achieve both.

In view of the foregoing, when etching the first region containing silicon and oxygen, it is required to suppress the cutting of the second region which is made of a material different form the first region and, at the same time, to suppress the reduction of the opening width due to the fluorocarbon-containing film.

Means for Solving the Problems

In an exemplary embodiment, there is provided a method of etching a first region containing a silicon atom and an oxygen atom selectively with respect to a second region made of a material different from the first region by performing a plasma processing on a processing target object. The processing target object includes the second region in which a recess is formed, the first region which fills the recess and covers the second region, and a mask which is provided with an opening above the recess and is provided on the first region. The method includes (a) performing one or more times of a sequence each comprising: (a1) forming a fluorocarbon-containing film on the processing target object by generating plasma of a processing gas containing a fluorocarbon gas and not containing an oxygen gas; and (a2) etching the first region with radicals of fluorocarbon contained in the fluorocarbon-containing film; and (b) reducing a film thickness of the fluorocarbon-containing film (hereinafter, referred to as "film thickness reducing process"). An alternating repetition in which the performing of the one or more times of the sequence and the film thickness reducing process are alternately repeated is performed.

In the method according to the exemplary embodiment, the processing gas for forming the fluorocarbon-containing film does not contain the oxygen gas. Accordingly, the second region is suppressed from being oxidized and the oxidized second region is suppressed from being etched by active species of the fluorocarbon. Since, however, the processing gas does not contain the oxygen gas, a width of the opening is reduced by the fluorocarbon-containing film, and the opening may be even blocked. To solve this problem of the reduction of the opening width, the film thickness reducing process is performed in the method according to the exemplary embodiment. Thus, according to the present method, it is possible to suppress cutting of the second region and the reduction of the opening width due to the fluorocarbon-containing film during the etching of the first region.

According to the exemplary embodiment, plasma of a processing gas containing a nitrogen trifluoride gas and a rare gas may be generated in the film thickness reducing process. In case that the nitrogen trifluoride gas is diluted with the rare gas, active species are incident on the processing target object in a substantially vertical direction with a small angular distribution. Therefore, it is possible to efficiently reduce the film thickness of the fluorocarbon-containing film which is formed thick on a horizontal plane of the processing target object, for example, on a top surface of the mask.

According to the exemplary embodiment, plasma of a processing gas containing only a nitrogen trifluoride gas may be generated in the film thickness reducing process. In this exemplary embodiment, active species are incident on the processing target object isotropically. Thus, it is possible to uniformly reduce the film thickness of the fluorocarbon-containing film formed on a certain surface of the processing target object.

According to the exemplary embodiment, plasma of a processing gas containing a nitrogen trifluoride gas and a rare gas is generated in a preset number of the film thickness reducing process included in the alternating repetition, and plasma of a processing gas containing only a nitrogen trifluoride gas is generated in a predetermined number of the film thickness reducing process included in the alternating repetition. In this exemplary embodiment, it is possible to efficiently reduce the film thickness of the fluorocarbon-containing film which is formed thick on the horizontal plane of the processing target object and, also, to uniformly reduce the film thickness of the fluorocarbon-containing film formed on the certain surface of the processing target object.

According to the exemplary embodiment, plasma of a processing gas containing an oxygen gas and a rare gas may be generated in the film thickness reducing process. Moreover, plasma of a processing gas containing only an oxygen gas may be generated in the film thickness reducing process. Further, plasma of a processing gas containing an oxygen gas and a rare gas may be generated in a preset number of the film thickness reducing process included in the alternating repetition, and plasma of a processing gas containing only an oxygen gas may be generated in a predetermined number of the film thickness reducing process included in the alternating repetition.

According to the exemplary embodiment, a pressure within a processing vessel in which the processing target object is accommodated may be set to be equal to or less than 2.666 Pa (20 mTorr) in the forming of the fluorocarbon-containing film. In this exemplary embodiment, plasma of the fluorocarbon gas is generated under a low-pressure environment. In this low-pressure environment, active species of the fluorocarbon are incident onto the processing target object with anisotropy, that is, with a small angular distribution in a substantially vertical direction. As a result, fluorocarbon-containing films are selectively formed on a top surface of the mask, on a top surface of the second region and on a top surface of the first region embedded in the second region. Further, a difference in thicknesses of the fluorocarbon-containing films formed on the top surface of the mask, the top surface of the second region and the top surface of the first region embedded in the second region can be reduced. Furthermore, in this low-pressure environment, the active species of the fluorocarbon enter the inside of both an opening with a high aspect ratio and an opening with a low aspect ratio. Thus, dependency of the film thickness of the fluorocarbon-containing film on the aspect ratio can be reduced.

According to the exemplary embodiment, a high frequency power for plasma generation, which allows an effective bias voltage ranging from 100 V to 300 V to be generated, may be used in the forming of the fluorocarbon-containing film. By using this high frequency power, energy of ions of the fluorocarbon can be reduced, and damage upon the processing target object by the ions can be suppressed.

In the forming of the fluorocarbon-containing film according to the exemplary embodiment, a capacitively coupled plasma processing apparatus may be used, and a voltage for attracting positive ions may be applied to a silicon-made electrode plate of an upper electrode of the plasma processing apparatus. In this exemplary embodiment, as positive ions collide with the electrode plate, silicon is released from the electrode plate. The released silicon combines with the active species of fluorine that exist within the plasma processing apparatus, so that the amount of the active species of the fluorine is reduced. As a result, the cutting of the second region is suppressed. Furthermore, as the positive ions are attracted toward the electrode plate, fluorocarbon adhering to a ceiling plate is removed. Therefore, an inner wall surface of the processing vessel can be maintained clean.

According to the exemplary embodiment, plasma of a rare gas may be generated in the etching of the first region. In this exemplary embodiment, rare gas ions produced by the generation of the plasma of the rare gas are incident on the fluorocarbon-containing film, so that radicals are generated from the fluorocarbon-containing film. These radicals etch the first region.

According to the exemplary embodiment, the first region may be made of silicon oxide, silicon oxynitride or carbon-containing silicon oxide. Further, according to the exemplary embodiment, the second region may be made of silicon, carbon, silicon nitride or a metal.

Effect of the Invention

As stated above, according to the exemplary embodiment, during the etching of the first region containing silicon and oxygen, it is possible to suppress the cutting of the second region which is made of a material different from the first region and to suppress the reduction of the opening width due to the fluorocarbon-containing film.

DETAILED DESCRIPTION

Figure 1:
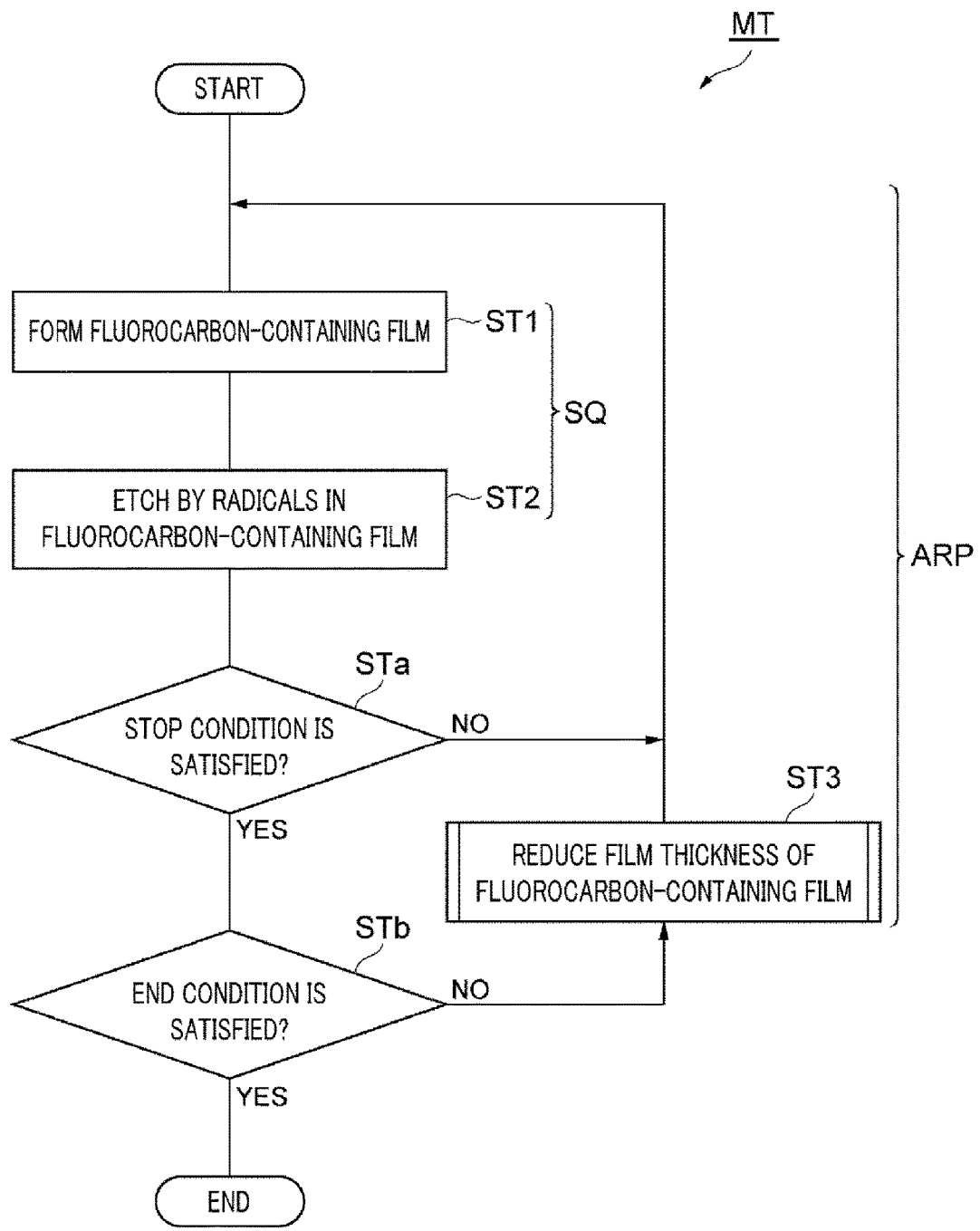
FIG. 1 is a flowchart for describing an etching method according to an exemplary embodiment.

In the following, exemplary embodiments will be described in detail, and reference is made to the accompanying drawings, which form a part of the description.

Throughout the drawings, same or corresponding parts will be assigned same reference numerals.

FIG. 1 is a flowchart for describing an etching method according to an exemplary embodiment. The method MT shown in FIG. 1 is directed to etching a first region containing a silicon atom and an oxygen atom selectively with respect to a second region made of a material different from the first region by performing a plasma processing on a processing target object.

Figure 2A:
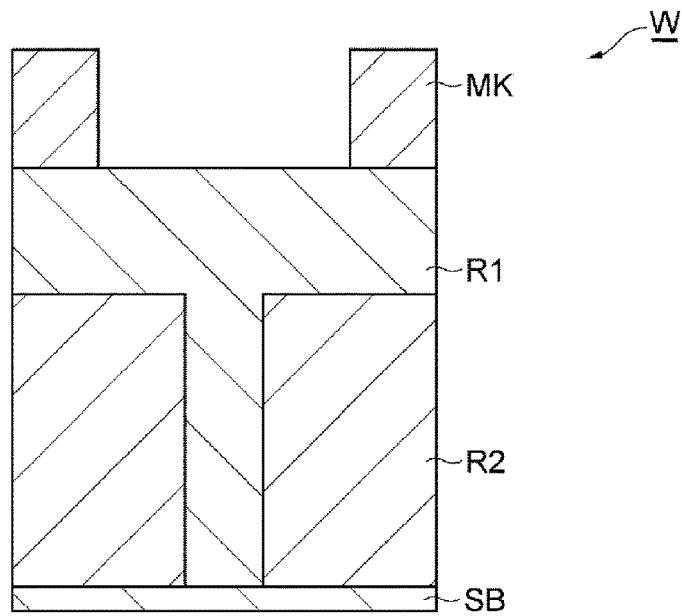
FIG. 2A and FIG. 2B are cross sectional views illustrating examples of a processing target object to which the method in the exemplary embodiment is applied.
Figure 2B:
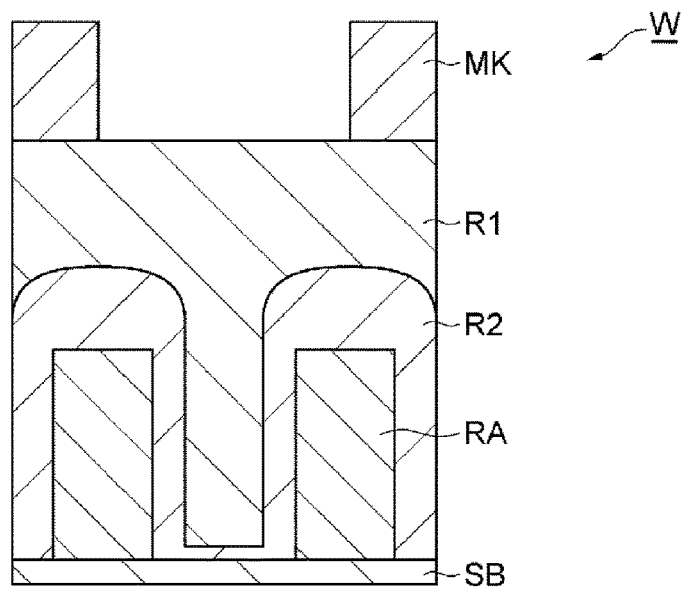

FIG. 2A and FIG. 2B are cross sectional views illustrating examples of the processing target object to which the method in the exemplary embodiment is applied. The processing target object shown in FIG. 2A, that is, a wafer W has a substrate SB, a first region R1, a second region R2 and a mask MK. The second region R2 is provided on the substrate SB and is provided with a recess formed therein. The first region R1 contains a silicon atom and an oxygen atom, and fills the recess and covers the second region R2. The mask MK is provided on the first region R1 and is provided with an opening above the recess formed in the second region R2. Hereinafter, the opening provided in the mask MK may be referred to as "mask opening."

The first region R1 may be made of, by way of example, but not limitation, silicon oxide ($SiO_2$), silicon oxynitride (SiON) or carbon-containing silicon oxide (SiOCH). The second region R2 is made of a material different from the first region R1. The second region R2 may be made of, by way of non-limiting example, silicon, carbon, silicon nitride or a metal. The mask MK may be made of organic film, by way of example, amorphous carbon.

FIG. 2B illustrates another example of the processing target object. A wafer W shown in FIG. 2B is obtained in the course of manufacturing a fin-type filed effect transistor. Like the processing target object shown in FIG. 2A, this wafer W includes a substrate SB, a first region R1, a second region R2 and a mask MK. Further, the wafer W illustrated in FIG. 2B further has a protruding region RA. The protruding region RA is protruded from the substrate SB. This protruding region RA forms a gate region, for example. The second region R2 is extended along surfaces of the protruding region RA and a surface of the substrate SB. In the wafer W depicted in FIG. 2B, the first region R1 is made of silicon oxide, and the second region R2 is made of silicon nitride. Below, the method MT will be explained in detail with respect to the processing target object shown in FIG. 2B as an example.

Figure 3:
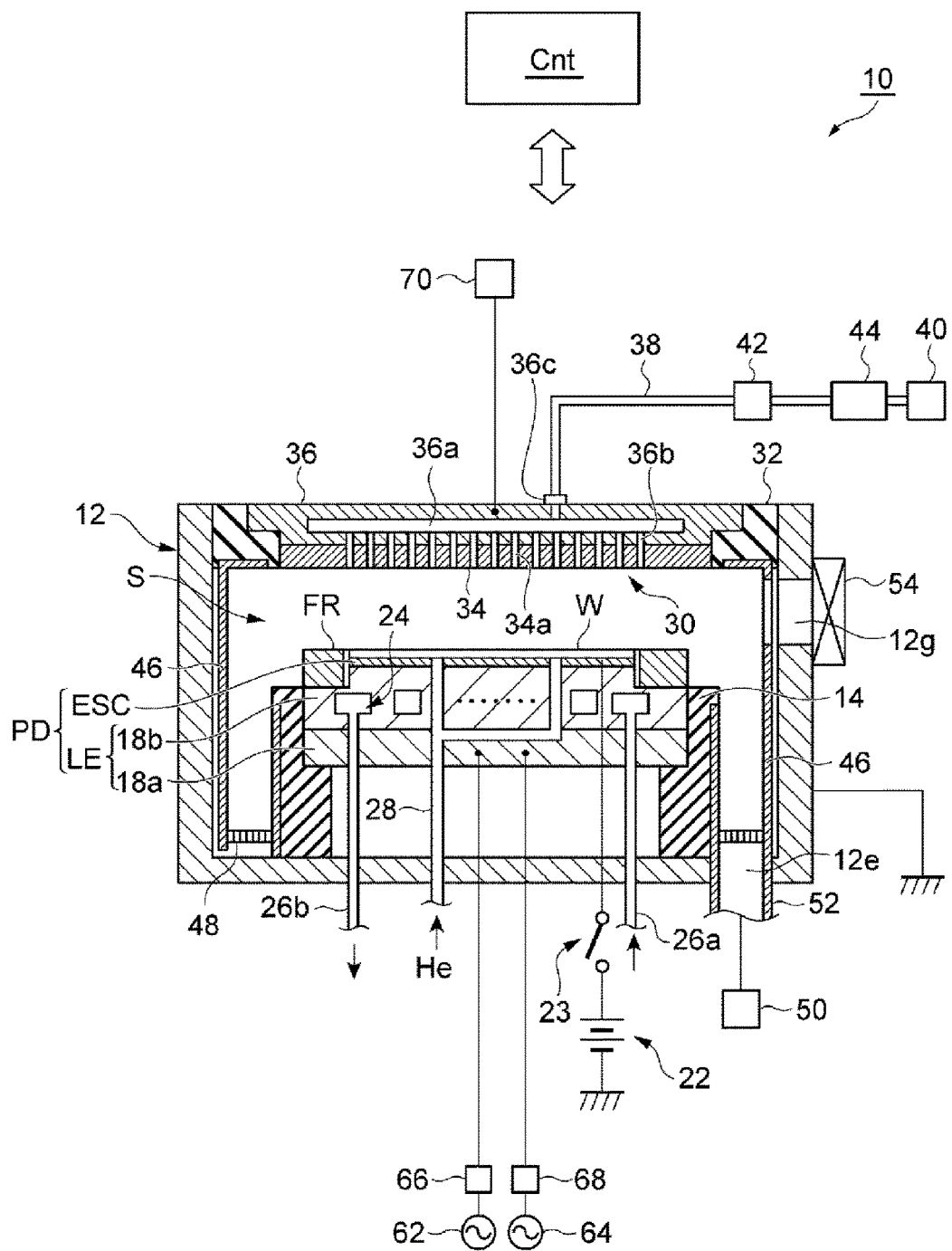
FIG. 3 is a diagram schematically illustrating an example of a plasma processing apparatus in which the method of FIG. 1 is performed.

In the method MT, prior to performing a first process ST1, the wafer W is accommodated within a processing vessel of a plasma processing apparatus. FIG. 3 is a diagram schematically illustrating an example of a plasma processing apparatus in which the method of FIG. 1 is performed. The plasma processing apparatus 10 shown in FIG. 3 is configured as a capacitively coupled plasma etching apparatus, and includes a substantially cylindrical processing vessel 12. An inner wall surface of the processing vessel 12 is made of, by way of non-limiting example, anodically oxidized aluminum. This processing vessel 12 is frame-grounded.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the wafer W on a top surface thereof. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, alumi aluminum and have a substantially disk shape. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is circulated between the coolant path 24 and the chiller unit. A temperature of the wafer W held by the electrostatic chuck ESC is controlled by adjusting a temperature of the coolant.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Formed between the upper electrode 30 and the lower electrode LE is a processing space S in which a plasma processing is performed on the wafer W.

The upper electrode 30 is supported at an upper portion of the processing vessel 12 with an insulating shield member 32 therebetween. In the exemplary embodiment, the upper electrode 30 is configured such that a distance from the top surface of the mounting table PD, i.e., a mounting surface on which the wafer W is placed is variable in a vertical direction. The upper electrode 30 may include an electrode plate 34 and an electrode supporting body 36. The electrode plate 34 faces the processing space S, and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a watercooling structure. A gas diffusion space 36a is formed within the electrode supporting body 36. Multiple gas through holes 36b are extended downwards from the gas diffusion space 36a, and these gas through holes 36b communicate with the gas discharge holes 34a, respectively. Further, the electrode supporting body 36 is also provided with a gas inlet opening 36c through which a processing gas is introduced into the gas diffusion space 36a, and this gas inlet opening 36c is connected to a gas supply line 38.

A gas source group 40 is connected to the gas supply line 38 via a valve group 42 and a flow rate controller group 44. The gas source group 40 includes a plurality of gas sources such as a source of a fluorocarbon gas, a source of a rare gas, a source of nitrogen trifluoride ($NF_3$) gas and a source of an oxygen ($O_2$) gas. The fluorocarbon gas contains at least one of a $C_4F_6$ gas and a $C_4F_8$ gas, for example. Further, the rare gas contains at least one of various rare gas species such as an Ar gas and a He gas.

The valve group 42 includes a multiple number of valves, and the flow rate controller group 44 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 44.

Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

At the bottom side of the processing vessel 12, a gas exhaust plate 48 is provided between the supporting member 14 and a side wall of the processing vessel 12. The gas exhaust plate 48 may be made of, by way of example, an aluminum member coated with ceramics such as $Y_2O_3$. The processing vessel 12 is also provided with a gas exhaust opening 12e under the gas exhaust plate 48. The gas exhaust opening 12e is connected with a gas exhaust device 50 via a gas exhaust line 52. The gas exhaust device 50 includes a vacuum pump such as a turbo molecular pump, and is capable of decompressing the space within the processing vessel 12 to a required vacuum level. Further, a carry-in/out opening 12g for the wafer W is provided at the side wall of the processing vessel 12, and the carry-in/out opening 12g is opened or closed by a gate valve 54.

The plasma processing apparatus 10 further includes a first high frequency power supply 62 and a second high frequency power supply 64. The first high frequency power supply 62 is configured to generate a high frequency power for plasma generation having a frequency ranging from 27 MHz to 100 MHz. Hereinafter, a "high frequency power" refers to the high frequency power for plasma generation. The first high frequency power supply 62 is connected to the lower electrode LE via a matching device 66. The matching device 66 is a circuit configured to match an output impedance of the first high frequency power supply 62 and an input impedance at a load side (lower electrode LE side). The first high frequency power supply 62 may be connected to the upper electrode 30 via the matching device 66.

The second high frequency power supply 64 is configured to generate a high frequency bias power for ion attraction into the wafer W having a frequency ranging from 400 kHz to 13.56 MHz. The second high frequency power supply 64 is connected to the lower electrode LE via a matching device 68. The matching device 68 is a circuit configured to match an output impedance of the second high frequency power supply 64 and the input impedance at the load side (lower electrode LE side).

Further, the plasma processing apparatus 10 may further include a power supply 70. The power supply 70 is connected to the upper electrode 30. The power supply 70 is configured to apply, to the upper electrode 30, a voltage for attracting positive ions within the processing space S into the electrode plate 34. As an example, the power supply 70 is a DC power supply configured to generate a negative DC Voltage. As another example, the power supply 70 may be an AC power supply configured to generate an alternating current voltage having a relatively low frequency. The voltage applied from the power supply 70 to the upper electrode may be equal to or less than −150 V. That is, the voltage applied from the power supply 70 to the upper electrode 30 may be a negative voltage having an absolute value equal to or larger than 150. If such a voltage is applied to the upper electrode 30 from the power supply 70, the positive ions existing within the processing space S collide with the electrode plate 34. As a result, secondary electrons and/or silicon is released from the electrode plate 34. The released silicon combines with active species of fluorine which exist within the processing space S, and, thus, the amount of the active species of the fluorine is reduced.

Further, in the exemplary embodiment, the plasma processing apparatus 10 may further include a control unit Cnt. The control unit Cnt is implemented by a computer including a processor, a storage unit, an input device, a display device, and so forth, and is configured to control individual components of the plasma processing apparatus 10. In the control unit Cnt, an operator can input commands through the input device to manage the plasma processing apparatus 10, and an operational status of the plasma processing apparatus 10 can be visually displayed on the display device. Further, the storage unit of the control unit Cnt stores therein a control program for controlling various processings performed in the plasma processing apparatus 10 by the processor, or a program for allowing each component of the plasma processing apparatus 10 to perform a processing according to processing conditions, i.e., a processing recipe.

Figure 4A:
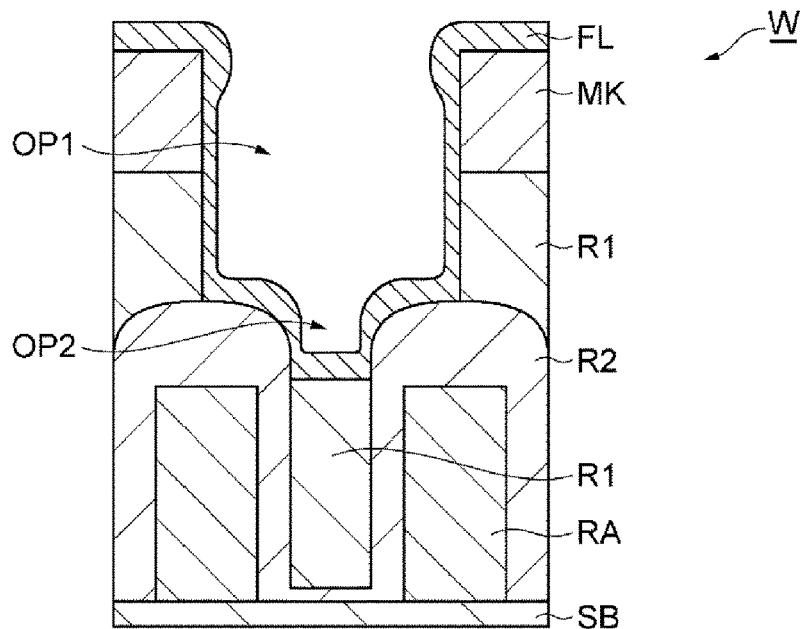
FIG. 4A and FIG. 4B are cross sectional views showing a processing target object in the course of performing the method MT.
Figure 4B:
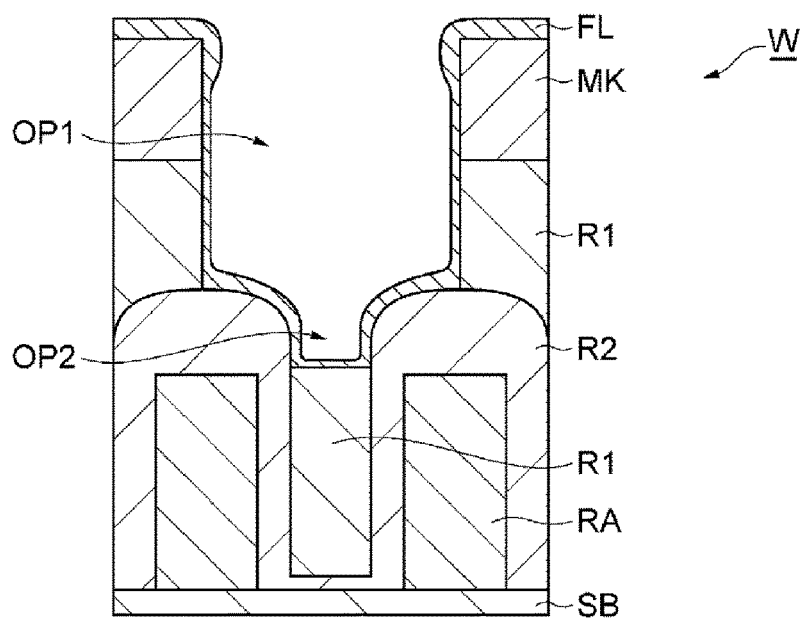
Figure 5A:
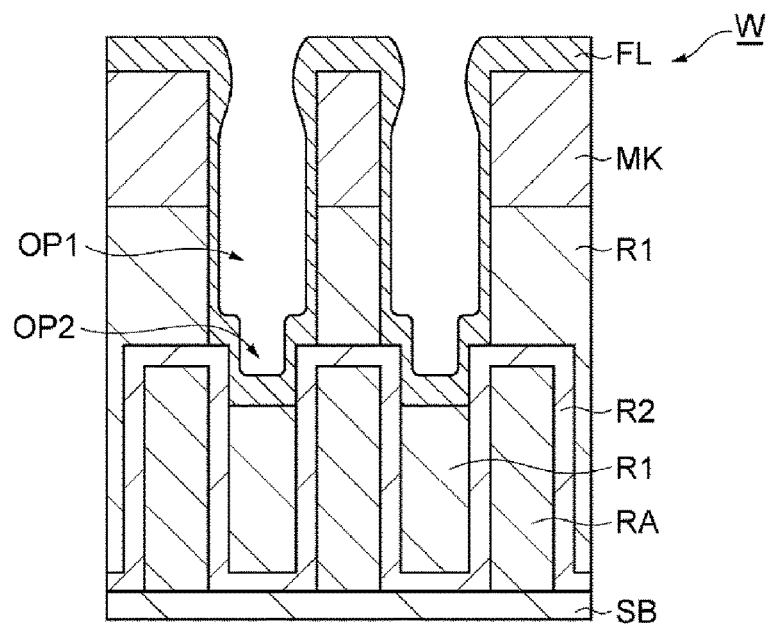
FIG. 5A and FIG. 5B are cross sectional views showing a processing target object in the course of performing the method MT.
Figure 5B:
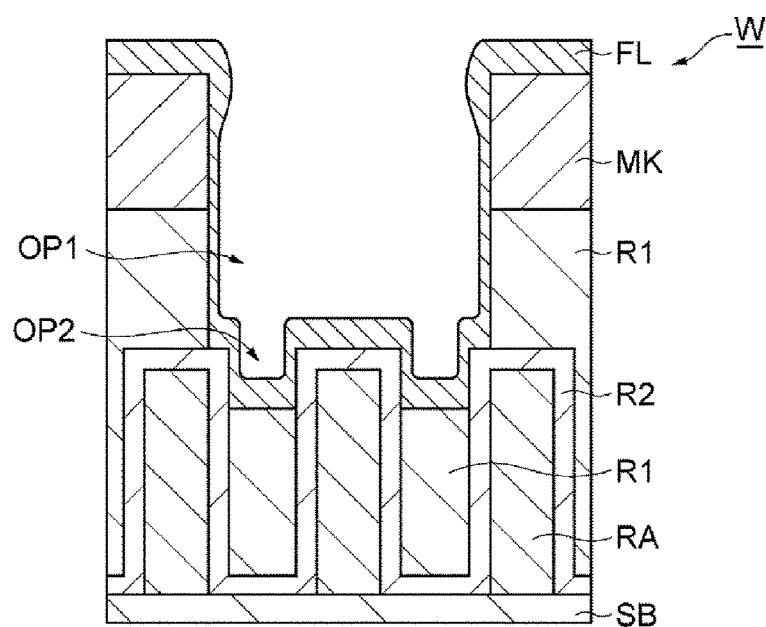
Figure 6A:
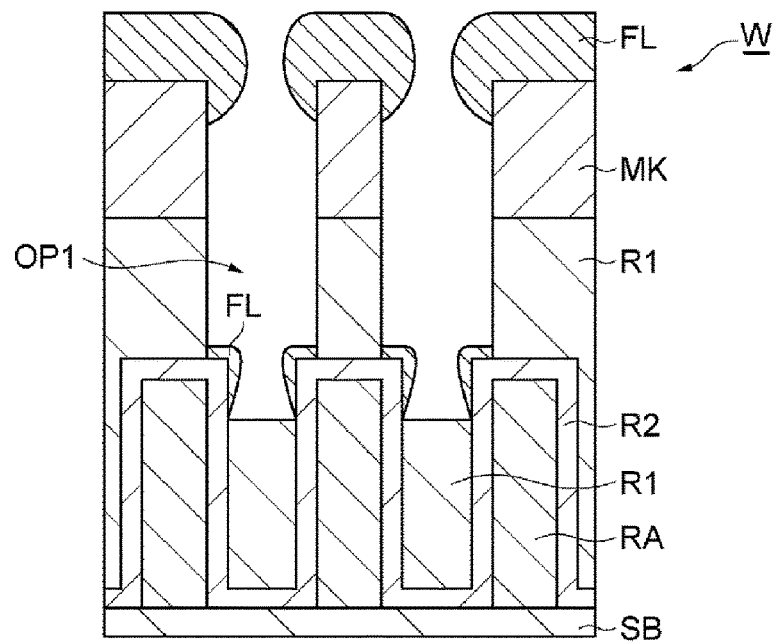
FIG. 6A and FIG. 6B are cross sectional views illustrating a processing target object for the purpose of comparison.
Figure 6B:
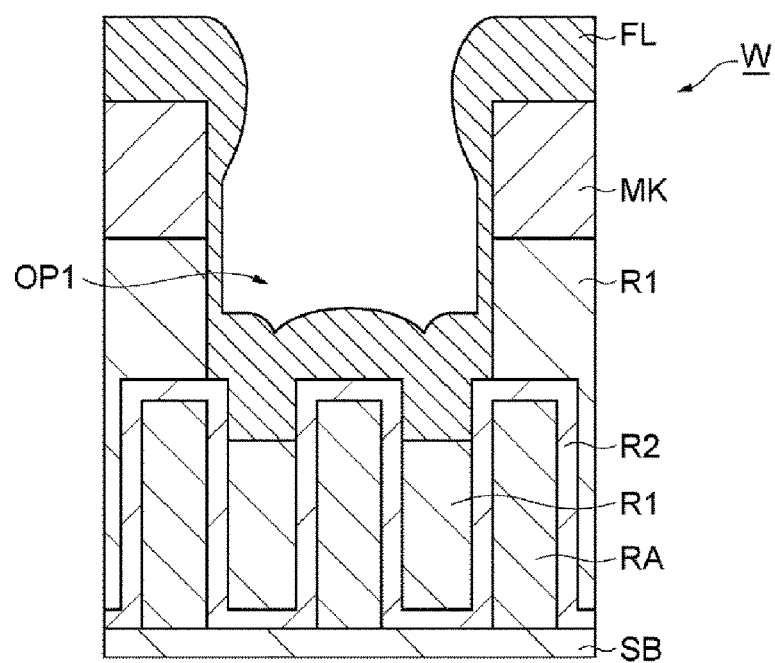

Now, referring back to FIG. 1, the method MT will be elaborated. In the following description, reference will be made to FIG. 4A to FIG. 7B appropriately. FIG. 4A and FIG. 4B, FIG. 5A and FIG. 5B and FIG. 7A and FIG. 7B are cross sectional views illustrating processing target objects in the course of performing the method MT. FIG. 6A and FIG. 6B are cross sectional views illustrating a processing target object for comparison.

As depicted in FIG. 1, in the method MT, there is performed a repetition ARP in which one or more times of a sequence SQ each including a process ST1 and a process ST2, and a process ST3 are alternately performed. In the method MT, the process ST1 is first performed. In the process ST1, a fluorocarbon containing film is formed on a surface of a wafer W. For the purpose, in the process ST1, a processing gas is supplied into a processing vessel of a plasma processing apparatus, and plasma of the processing gas is generated. The processing gas for use in the process ST1 contains a fluorocarbon gas ($C_xF_y$ gas) and does not contain an oxygen gas ($O_2$ gas). The fluorocarbon gas may include, by way of example, at least one of a $C_4F_6$ gas and a $C_4F_8$ gas. Further, this processing gas may contain at least one kind of various rare gases such an Ar gas and a He gas. Furthermore, a flow rate of the fluorocarbon gas in the processing gas may range from, by way of example, but not limitation, 4 sccm to 12 sccm or 2 sccm to 6 sccm.

In case of performing the process ST1 in the plasma processing apparatus 10, the processing gas is supplied into the processing vessel 12 from the gas source group 40. Further, in the process ST1, the high frequency power is supplied from the first high frequency power supply 62 to the lower electrode LE. Further, in the process ST1, the high frequency bias power may or may not be applied to the lower electrode LE from the second high frequency power supply 64. In the process ST1 according to the exemplary embodiment, the high frequency bias power supplied from the second high frequency power supply 64 to the lower electrode LE may be 0 W. Furthermore, in the process ST1, the pressure in the space within the processing vessel 12 is set to a preset pressure by the gas exhaust device 50. As a result, the plasma of the processing gas is generated within the processing vessel 12.

In the process ST1, active species of the fluorocarbon are incident upon the surface of the wafer W. Accordingly, the first region R1 is slightly etched. Further, a fluorocarbon-containing film FL is formed on the surface of the wafer W. The cross sectional view of FIG. 4A illustrates a state in which, as the method MT progresses, a portion of the first region R1 exposed through the mask opening is etched to thereby form an upper opening OP1, and the etching of the first region R1 progresses down to the inside of the recess formed in the second region R2 to thereby form a lower opening OP2 continuous to the upper opening OP1 in a portion of the first region R1 embedded in the second region R2. In this state, through the process ST1, the fluorocarbon-containing film FL is formed on the surface of the wafer W, that is, on a top surface and a side surface of the mask MK, a side surface of the first region R1 left between the mask MK and the second region R2, a surface of the second region R2 and a top surface of the first region R1 existing within the recess formed in the second region R2.

In the subsequent process ST2, the first region R1 is etched by radicals in the fluorocarbon-containing film FL. For the purpose, in the process ST2, plasma of a rare gas, for example, an Ar gas is generated within the processing vessel of the plasma processing apparatus. A processing time of the process ST2 and a processing time of the process ST1 may be set appropriately. In the exemplary embodiment, a ratio of the processing time of the process ST1 to a sum of the processing time of the process ST1 and the processing time of the process ST2 may be set to be in a rage from 30% to 70%.

In case of performing the process ST2 in the plasma processing apparatus 10, the rare gas is supplied from the gas source group 40. Further, in the process ST2, the high frequency power from the first high frequency power supply 62 is supplied to the lower electrode LE. Further, in the process ST2, the high frequency bias power may or may not be applied to the lower electrode LE from the second high frequency power supply 64. In the process ST2 according to the exemplary embodiment, the high frequency bias power supplied from the second high frequency power supply 64 to the lower electrode LE may be 0 W. Furthermore, in the process ST2, the pressure in the space within the processing vessel 12 is set to a preset pressure by the gas exhaust device 50. For example, the pressure in the space within the processing vessel 12 is set to be a value within a range from 20 mTorr (2.666 Pa) to 50 mTorr (6.666 Pa), for example, 30 mTorr (4 Pa) or less. As a result, the plasma of the rare gas is generated within the processing vessel 12, and ions of atoms of the rare gas are irradiated to the wafer W placed on the mounting table PD.

In the process ST2, active species of atoms of the rare gas, for example, the ions of the atoms of the rare gas are irradiated to the fluorocarbon-containing film FL. Accordingly, fluorocarbon radicals in the fluorocarbon-containing film FL etches the first region R1, as shown in FIG. 4B. Through this process ST2, a film thickness of the fluorocarbon-containing film FL is reduced.

In the method MT, the sequence SQ including the process ST1 and the process ST2 are performed one or more times. Then, in a process STa, it is determined whether a stop condition is satisfied. For example, in the process STa, it is determined that the stop condition is satisfied when the sequence SQ has been repeated a preset number of times. If it is determined in the process STa that the stop condition is not satisfied, the sequence SQ is performed again. Meanwhile, if it is determined in the process STa that the stop condition is satisfied, a process STb is performed. A process after the process STb will be explained later.

As stated above, the processing gas used in the process ST1 does not contain an oxygen gas. Thus, the second region R2 is suppressed from being oxidized and the oxidized second region R2 is suppressed from being etched by the active species of the fluorocarbon. Since, however, the processing gas used in the first process ST1 does not contain the oxygen gas, the width of the opening such as the upper opening OP1 and the lower opening OP2 may be narrowed by the fluorocarbon-containing film FL if the sequence SQ is performed one or more times, and the openings may be even blocked.

As a solution to the reduction of the width of the opening, the pressure within the processing vessel of the plasma processing apparatus is set to be equal to or less than 20 mTorr (2.666 Pa) in the process ST1 according to the exemplary embodiment. Further, a ratio of the flow rate of the fluorocarbon gas to a total flow rate of the processing gas supplied into the processing vessel in the process ST1 is set to be in a range from 0.1% to 1%. If the plasma of the processing gas in which the fluorocarbon gas is diluted is generated under the low-pressure environment, the active species of the fluorocarbon are incident onto the wafer W in a substantially vertical direction with anisotropy, that is, with a small angular distribution. As a result, the fluorocarbon-containing film FL is formed on a top surface of the mask MK, on a top surface of the second region R2 and on a top surface of the first region R1 embedded in the second region R2 to be thicker than that on other surfaces. That is, the fluorocarbon-containing film FL is selectively formed on the top surface of the mask MK, the top surface of the second region R2 and the top surface of the first region R1 embedded in the second region R2. Accordingly, the reduction of the width of the opening is suppressed.

Further, in this low-pressure environment, the active species of the fluorocarbon enter the inside of both a relatively small opening and a relatively large opening. Below, referring to FIG. 5A to FIG. 6B, this will be explained in detail. A wafer W may have both a region (hereinafter, referred to as "high AR region"), as shown in FIG. 5A and FIG. 6A, on which a mask MK is provided with a narrow mask opening and in which an upper opening OP1 having a high aspect ratio is formed; and a region (hereinafter, referred to as "low AR region"), as shown in FIG. 5B and FIG. 6B, on which the mask MK is provided with a wide mask opening and in which an upper opening OP1 having a low aspect ratio is formed.

If plasma of a processing gas generated under a high pressure condition is used for this wafer W, a large quantity of the active species of the fluorocarbon may be supplied onto the top surface of the mask MK, so that the active species of the fluorocarbon is difficult to enter into the upper opening OP1 of the high AR region. As a result, as depicted in FIG. 6A, the thick fluorocarbon-containing film FL is formed on the top surface of the mask MK, whereas the fluorocarbon-containing film formed on the surfaces of the second region R2 and the top surface of the first region R1 embedded in the second region R2 has an insufficient film thickness. Consequently, the second region R2 is cut, and the etching of the first region R1 is stopped. Further, if the plasma of the processing gas generated under the high pressure condition is used, a large amount of the active species of the fluorocarbon enters the inside of the upper opening OP1 of the low AR region. As a result, as shown in FIG. 6B, an excessively thick fluorocarbon-containing film FL is formed on the surface of the second region R2 and the top surface of the first region R1 embedded in the second region R2. As a consequence, the etching of the first region R1 is stopped.

Meanwhile, in the process ST1 according to the exemplary embodiment, the plasma of the processing gas is generated under a low pressure condition. Under the low pressure condition, the active species of the fluorocarbon based on the generated plasma can easily enter the upper opening OP1 of any of the high AR region and the low AR region. Accordingly, as shown in FIG. 5A and FIG. 5B, a difference between the film thickness of the fluorocarbon-containing film FL formed on the surface of the wafer W of the high AR region and the film thickness of the fluorocarbon-containing film FL formed on the surface of the wafer W of the low AR region is reduced. That is, dependency of the film thickness of the fluorocarbon-containing film FL on the aspect ratio is reduced. Furthermore, as depicted in FIG. 5A and FIG. 5B, a difference between the film thickness of the fluorocarbon-containing film FL formed on the top surface of the mask MK and the film thickness of the fluorocarbon-containing film FL formed on the top surface of the first region R1 embedded in the second region R2 is also reduced in both of the high AR region and the low AR region.

If, however, the plasma of the processing gas is generated under the low pressure condition, the energy of the ions of the fluorocarbon is increased, so that damage is inflicted on the wafer W. For example, a damage may be inflicted on the second region R2. For this reason, in the process ST1 according to the exemplary embodiment, the high frequency power for plasma generation is set to have a power level allowing an effective bias voltage ranging from 100 V to 300 V to be generated. By way of example, in the plasma processing apparatus 10, the high frequency power for plasma generation capable of generating such an effective bias voltage may be a power less than 300 W. As a result, the energy of the ions of the fluorocarbon generated under the low pressure condition is reduced, so that the damage upon the wafer W is suppressed.

Further, in the process ST1 according to the exemplary embodiment, the high frequency power for plasma generation may be modulated in a pulse shape. That is, in the process ST1, the high frequency power for plasma generation may be alternately switched between a first level and a second level lower than the first level. A frequency of the pulse modulation, in which a first period during which the high frequency power has the first level and a second period during which the high frequency power has the second level constitute a single cycle, may be set to be, by way of non-limiting example, 2 kHz to 40 kHz. Further, a ratio of the first period with respect to the single cycle, that is, a duty ratio may be set to be in a range from 20% to 80%. As the high frequency power for plasma generation is pulse-modulated, a radical flux is attenuated more slowly than an ion flux in the second period. Accordingly, since there exists a time period during which only radicals are irradiated, a ratio of the ion flux is lowered. That is, radicals are generated more than ions. Thus, the etching of the first region R1 progresses, and the exposed second region R2, that is, the second region R2 which is not covered with the fluorocarbon-containing film FL is suppressed from being etched.

Furthermore, in the process ST1 according to the exemplary embodiment, a voltage from the power supply 70 may be applied to the upper electrode 30. The voltage applied to the upper electrode 30 from the power supply 70 may be equal to or less than −150 V. That is, the voltage applied to the upper electrode 30 from the power supply 70 may be a negative voltage having an absolute value equal to or larger than 150 V. If such a voltage is applied to the upper electrode 30 from the power supply 70, positive ions collide with the electrode plate 34. Accordingly, silicon is released from the electrode plate 34. The released silicon combines with active species of fluorine which exist within the plasma processing apparatus, so that the amount of the active species of the fluorine therein is reduced. As a result, the cutting of the second region R2 is suppressed. Furthermore, as the positive ions are attracted toward the electrode plate 34, the fluorocarbon adhering to the surface of the electrode plate 34 is removed. Therefore, an inner wall surface of the processing vessel is maintained clean.

Further, in the process ST2 according to the present exemplary embodiment, the pressure within the processing vessel is set to be 30 mTorr (4 Pa) or less. Further, the high frequency bias power may be set to be 0 W. Under these conditions, a distribution of an incident angle of rare gas ions on the wafer W becomes smaller, that is, the ions are incident on the wafer W in a substantially vertical direction with a smaller angular distribution. Accordingly, the first region R1 can be etched efficiently. Further, the damage on the second region R2 is suppressed.

Furthermore, in the process ST2 according to the exemplary embodiment, a voltage from the power supply 70 may be applied to the upper electrode 30. The voltage applied to the upper electrode 30 from the power supply 70 may be equal to or less than −150 V. That is, the voltage applied to the upper electrode 30 from the power supply 70 may be a negative voltage having an absolute value equal to or larger than 150 V. During a processing period of the process ST2, the active species of the fluorine generated in the process ST1 may not be completely removed and may remain in the processing vessel 12. In the process ST2, the silicon released from the electrode plate 34 as the voltage is applied to the upper electrode 30 from the power supply 70 is combined with the active species of the fluorine which exist within the processing space S, so that the amount of the active species of the fluorine is reduced. Therefore, the etching of the second region R2 by the active species of the fluorine is suppressed.

Referring back to FIG. 1, in the process STb, it is determined whether an end condition is satisfied. For example, in the process STb, it is determined that the end condition is satisfied when the number of the alternating repetition ARP including one or more times of the sequence SQ and the process ST3 to be described later reaches a preset number. If it is determined in the process STb that the end condition is not satisfied, the process ST3 is performed. The process ST3 will be described later. Meanwhile, if it is determined in the process STb that the end condition is satisfied, the method MT is ended. Further, in the repetition ARP, the number of executions of the sequence SQ may be differed. For example, in the repetition ARP, the number of executions of the sequence SQ performed later may be smaller than the number of executions of the sequence SQ performed earlier. Furthermore, the number of executions of the sequence SQ may be gradually decreased in the repetition ARP.

Figure 7A:
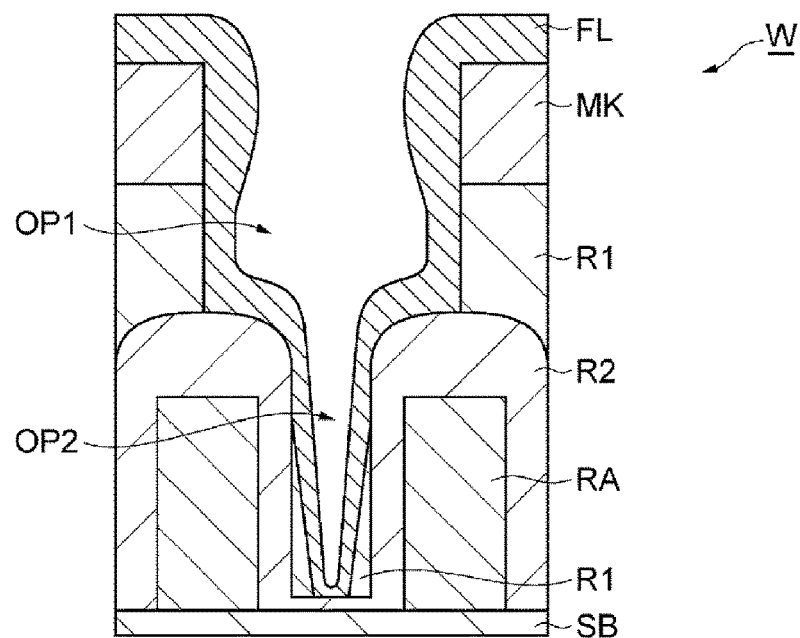
FIG. 7A and FIG. 7B are cross sectional views illustrating a processing target object in the middle of performing the method MT.
Figure 7B:
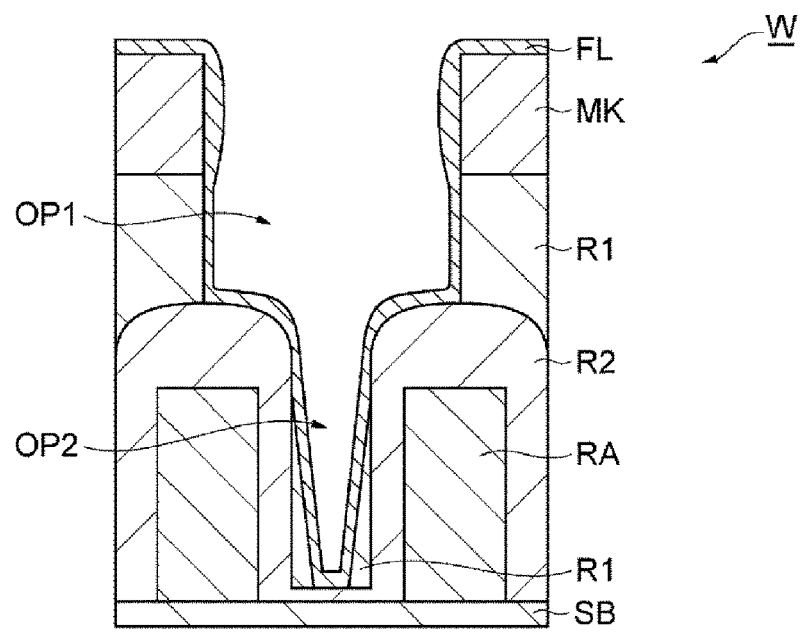

As illustrated in FIG. 7A, by executing the sequence SQ one or more times as stated above, the film thickness of the fluorocarbon-containing film FL is increased, and this fluorocarbon-containing film FL causes the reduction of the width of the opening. As another solution to the reduction of the width of the opening, the process ST3 is performed in the method MT. In the process ST3, a processing of reducing the film thickness of the fluorocarbon-containing film FL is performed. Accordingly, as illustrated in FIG. 7B, the film thickness of the fluorocarbon-containing film FL is reduced, and the reduction of the width of the opening due to the fluorocarbon-containing film FL is suppressed.

In the process ST3, plasma of a processing gas capable of etching the fluorocarbon-containing film FL is generated within the processing vessel of the plasma processing apparatus. A processing time of the process ST3 may be set as required. When performing the process ST3 in the plasma processing apparatus 10, the processing gas is supplied from the gas source group 40. Further, in the process ST3, the high frequency power is supplied to the lower electrode LE from the first high frequency power supply 62. Moreover, in the process ST3, the high frequency bias power may be or may not be supplied to the lower electrode LE from the second high frequency power supply 64. In the process ST3 according to the exemplary embodiment, the high frequency bias power supplied from the second high frequency power supply 64 to the lower electrode LE may be 0 W. Furthermore, in the process ST3, the pressure in the space within the processing vessel 12 is set to a preset pressure by the gas exhaust device 50. Accordingly, the plasma of the processing gas is generated within the processing vessel 12, and active species are irradiated to the wafer W placed on the mounting table PD.

In the process ST3, plasma of a processing gas containing a nitrogen trifluoride ($NF_3$) gas and a rare gas may be generated, for example. In case that the nitrogen trifluoride gas is diluted with the rare gas, active species are incident on the wafer W with a small angular distribution in a substantially vertical direction. Accordingly, it is possible to efficiently reduce the film thickness of the fluorocarbon-containing film formed thick on a horizontal plane of the wafer W, for example, on the top surface of the mask MK. A ratio of a flow rate of the nitrogen trifluoride gas to a total flow rate of the processing gas containing the nitrogen trifluoride gas and the rare gas may be in a range from, but not limited to, 0.3% to 10%.

In the process ST3 according to the exemplary embodiment, plasma of a processing gas containing only a nitrogen trifluoride gas may be generated. In this exemplary embodiment, active species are incident on the wafer W isotropically. Accordingly, it is possible to uniformly reduce the film thickness of the fluorocarbon-containing film formed on a certain surface of the wafer W. As depicted in FIG. 7A, the fluorocarbon-containing film FL is formed along a sidewall surface forming the lower opening OP2 as well as on the top surface of the mask MK, the top surface of the second region R2 and the top surface of the first region R1. The surplus fluorocarbon-containing film FL formed along the sidewall surface may cause generation of residue of the first region R1 at a corner portion on a bottom portion side of the second region R2. In this exemplary embodiment, by allowing the active species to reach the wafer W isotropically, the film thickness of the surplus fluorocarbon-containing film FL formed along the sidewall surface is reduced. Accordingly, the generation of the residue of the first region R1 is suppressed. As a result, it is possible to increase the width of the lower opening OP2 at a deep portion thereof.

In the exemplary embodiment, the plasma of the processing gas containing the nitrogen trifluoride gas and the rare gas may be generated in a preset number of processes ST3 included in the repetition ARP in which one or more times of the sequence SQ and the process ST3 are performed alternately, and the plasma of the processing gas containing only the nitrogen trifluoride gas may be generated in a predetermined number of processes ST3 included in the corresponding repetition ARP. For example, in the repetition ARP, the process ST3 of generating the plasma of the processing gas containing the nitrogen trifluoride gas and the rare gas and the process ST3 of generating the plasma of the processing gas containing only the nitrogen trifluoride gas may be alternately performed. According to this exemplary embodiment, the film thickness of the fluorocarbon-containing film FL formed thick on the horizontal plane of the wafer W can be efficiently reduced, and the film thickness of the fluorocarbon-containing film FL formed on a certain surface of the wafer W can be uniformly reduced.

Further, in the process ST3, plasma of a processing gas containing an oxygen gas ($O_2$ gas) and a rare gas may be generated. That is, as the processing gas contributing to the etching of the fluorocarbon-containing film, the oxygen gas may be used instead of the nitrogen trifluoride gas. In the process ST3 according to the exemplary embodiment, the plasma of the processing gas containing only the oxygen gas may be generated. Furthermore, in the exemplary embodiment, the plasma of the processing gas containing the oxygen gas and the rare gas may be generated in a preset number of processes ST3 included in the repetition ARP, and the plasma of the processing gas containing only the oxygen gas may be generated in a predetermined number of processes ST3 included in the repetition ARP. By way of non-limiting example, in the repetition ARP, the process ST3 of generating the plasma of the processing gas containing the oxygen gas and the rare gas and the process ST3 of generating the plasma of the processing gas containing only the oxygen gas may be performed alternately. As stated above, in the various examples of processes ST3, the oxygen gas may be used instead of the nitrogen trifluoride gas.

Now, various kinds of experiments conducted to investigate the method MT will be explained. However, it should be noted that the following experimental examples are not intended to be anyway limiting.

Experimental Example 1

Figure 8A:
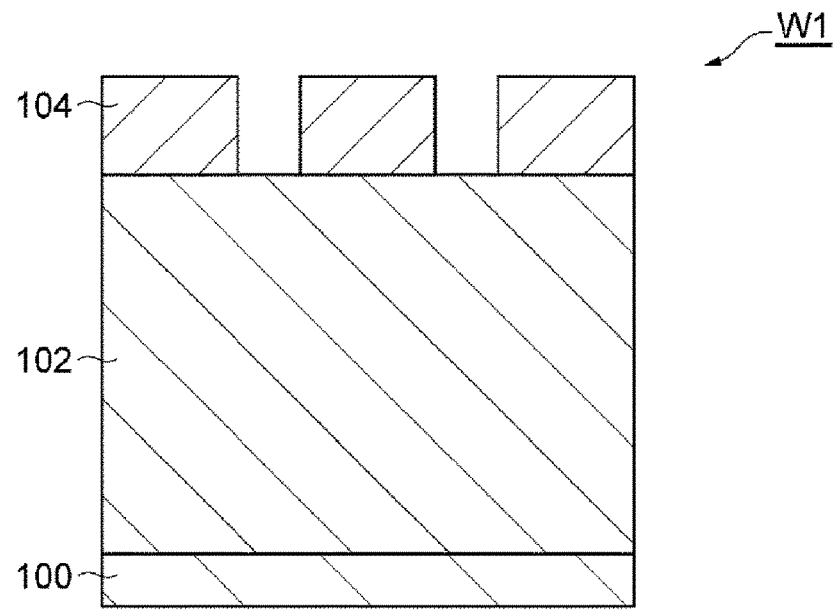
FIG. 8A and FIG. 8B are cross sectional views illustrating a wafer used in an experimental example 1.

In the experimental example 1, a wafer W1 shown in FIG. 8A is prepared. The wafer W1 has a silicon oxide film 102, which has a thickness of 200 nm, on a substrate 100 and has a mask 104 on the silicon oxide film 102. The mask 104 is made of amorphous carbon and is provided with an opening having a width of 40 nm. In the experimental example 1, the method MT is applied to the wafer W1 in the plasma processing apparatus 10 under conditions specified in Table 1. To elaborate, in the experimental example 1, the sequence SQ including the process ST1 and the process ST2 is executed 30 times, and, subsequently, the process ST3 and twenty (20) times of the sequence SQ are alternately performed 4 times. Further, for comparison, processings of a comparative example 1 and a comparative example 2 shown in Table 1 are performed on the wafer W1 in the plasma processing apparatus 10. In the comparative example 1, a process of forming the fluorocarbon-containing film by using the processing gas containing the oxygen gas and a process of exposing the wafer W1 to the plasma of the Ar gas are alternately performed 30 times. Further, in the comparative example 2, two processes which are the same as the process ST1 and the process ST2 of the experimental example 1 are alternately performed 30 times, and the process ST3 is not performed. Further, in all of the processes in the experimental example 1, the comparative example 1 and the comparative example 2, the high frequency bias power is set to be 0 W.

comparative example 2, the opening is blocked by the fluorocarbon-containing film, and the etching of the silicon oxide film 102 is stopped on the way. Further, in the experimental example 1, the width WB is found to be 18 nm. As clearly seen from the comparison of the result of the comparative example 2 and the result of the experimental example 1, even in case of using the processing gas without containing the oxygen gas in the process ST1, the opening OP having the wide width even at the deep portion thereof can be formed in the experimental example 1 including the process ST3, without blocking the opening OP.

Experimental Example 2

In an experimental example 2, the method MT is performed on a wafer W shown in FIG. 2B under conditions specified in Table 2 in the plasma processing apparatus 10. To be specific, in the experimental example 2, the sequence SQ including the process ST1 and the process ST2 is executed 30 times; the process ST3 is then performed; and, subsequently, the sequence SQ is performed 20 times. Further, for comparison, a processing of a comparative example 3 shown in Table 2 is performed on the wafer W shown in FIG. 2B in the plasma processing apparatus 10. In the comparative example 3, a process of forming the fluorocarbon-containing film by using the processing gas containing the oxygen gas and a process of exposing the wafer W to the plasma of the Ar gas are alternately performed 30 times. Furthermore, in all of the processes in the experimental example 2 and the comparative example 3, the high

TABLE 1

| | Order of execution | Number of repetition | Number of executions of sequence | Process | C$_4$F$_6$ gas flow rate (sccm) | Ar gas flow rate (sccm) | O$_2$ gas flow rate (sccm) | NF$_3$ gas flow rate (sccm) | Pressure (mTorr) | High frequency power Frequency (MHz) | High frequency power Power (W) | Processing time (sec) |
|---|---|---|---|---|---|---|---|---|---|---|---|---|
| Experimental example 1 | 1 | — | 30 | ST1 | 10 | 1000 | 0 | 0 | 20 | 40 | 100 | 5 |
| | | | | ST2 | 0 | 1000 | 0 | 0 | 20 | 40 | 300 | 5 |
| | 2 | 4 | — | ST3 | 0 | 480 | 0 | 20 | 60 | 40 | 300 | 5 |
| | | | 20 | ST1 | 10 | 1000 | 0 | 0 | 20 | 40 | 100 | 5 |
| | | | | ST2 | 0 | 1000 | 0 | 0 | 20 | 40 | 300 | 5 |
| Comparative example 1 | 1 | — | 30 | — | 10 | 1000 | 5 | 0 | 20 | 40 | 100 | 5 |
| | 2 | | | — | 0 | 1000 | 0 | 0 | 20 | 40 | 300 | 5 |
| Comparative example 2 | 1 | — | 30 | — | 10 | 1000 | 0 | 0 | 20 | 40 | 100 | 5 |
| | 2 | | | — | 0 | 1000 | 0 | 0 | 20 | 40 | 300 | 5 |

Figure 8B:
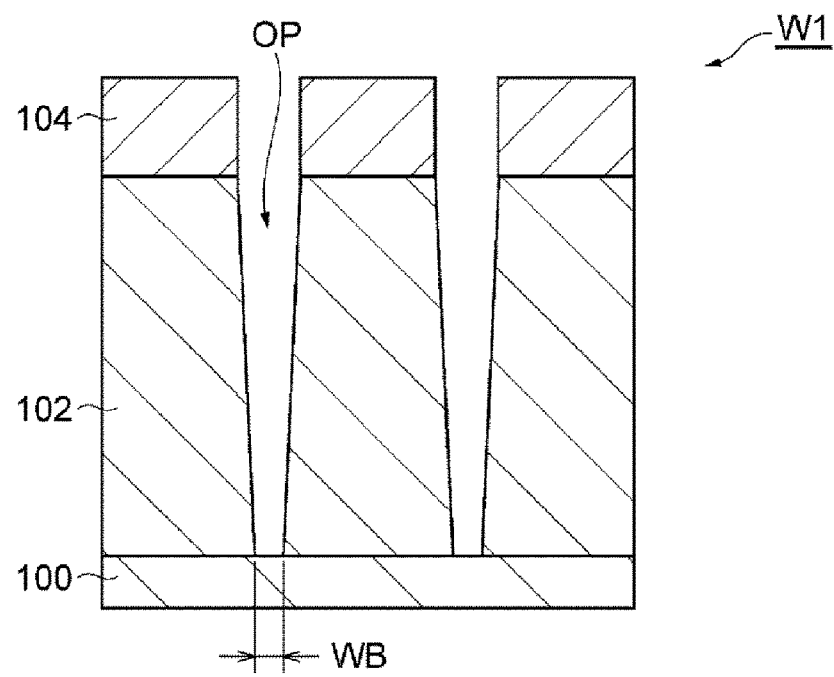

As depicted in FIG. 8B, a width WB of a bottom portion of an opening OP formed in the silicon oxide film 102 is measured. As a result of measurement, the width WB is found to be 16 nm in the comparative example 1. In the frequency bias power is set to be 0 W. In addition, the first region R1 of the wafer W used in the experimental example 2 and the comparative example 3 is made of silicon oxide, and the second region R2 thereof is made of silicon nitride.

TABLE 2

| | Order of execution | Number of executions of sequence | Process | C$_4$F$_6$ gas flow rate (sccm) | Ar gas flow rate (sccm) | O$_2$ gas flow rate (sccm) | NF$_3$ gas flow rate (sccm) | Pressure (mTorr) | High frequency power Frequency (MHz) | High frequency power Power (W) | Processing time (sec) |
|---|---|---|---|---|---|---|---|---|---|---|---|
| Experimental example 2 | 1 | 30 | ST1 | 10 | 1000 | 0 | 0 | 20 | 40 | 100 | 5 |
| | | | ST2 | 0 | 1000 | 0 | 0 | 20 | 40 | 300 | 5 |
| | 2 | — | ST3 | 0 | 480 | 0 | 20 | 60 | 40 | 300 | 5 |
| | 3 | 20 | ST1 | 10 | 1000 | 0 | 0 | 20 | 40 | 100 | 5 |
| | | | ST2 | 0 | 1000 | 0 | 0 | 20 | 40 | 300 | 5 |

TABLE 2-continued

|  | Order of execution | Number of executions of sequence | Process | C$_4$F$_6$ gas flow rate (sccm) | Ar gas flow rate (sccm) | O$_2$ gas flow rate (sccm) | NF$_3$ gas flow rate (sccm) | Pressure (mTorr) | High frequency power Frequency (MHz) | Power (W) | Processing time (sec) |
|---|---|---|---|---|---|---|---|---|---|---|---|
| Comparative exampe 3 | 1 | 30 | — | 10 | 1000 | 5 | 0 | 20 | 40 | 100 | 5 |
|  | 2 |  | — | 0 | 1000 | 0 | 0 | 20 | 40 | 300 | 5 |

Figure 9:
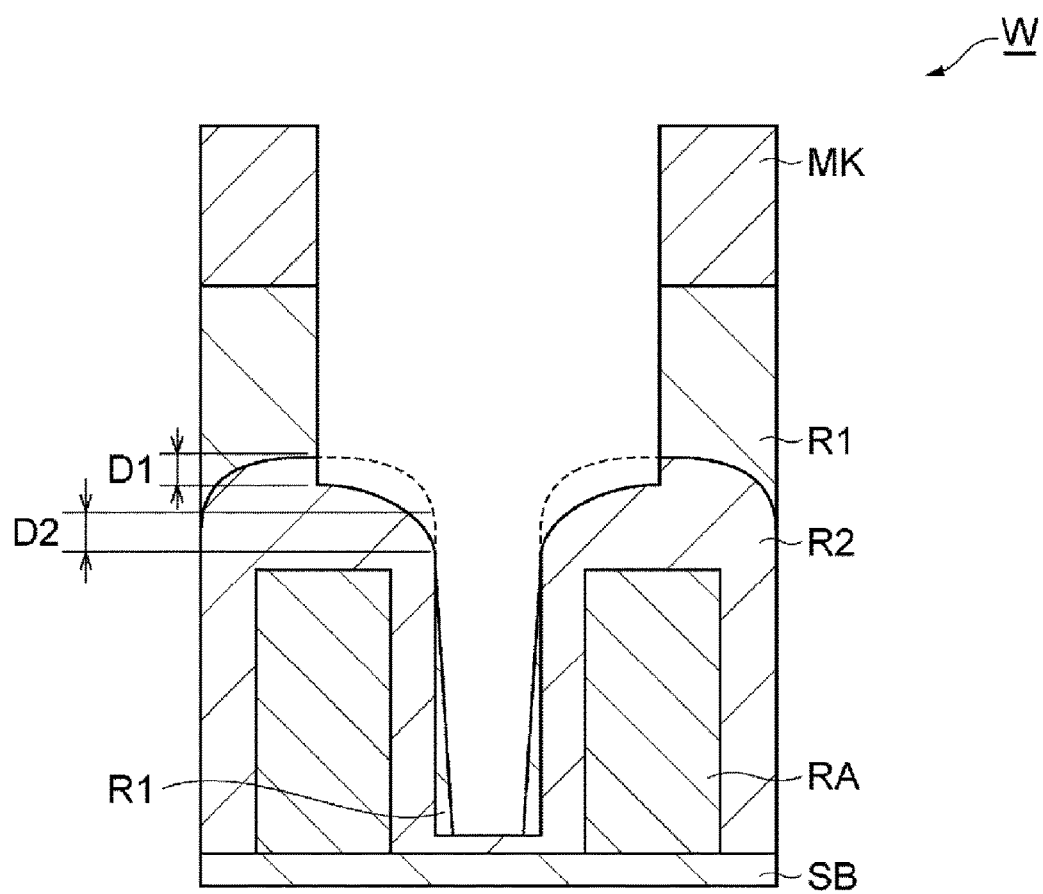
FIG. 9 is a cross sectional view showing dimension measured in an experimental example 2.

As shown in FIG. 9, a film thickness decrement D1 of the second region R2 directly under an edge portion of the mask MK and a film thickness decrement D2 at a shoulder portion of the second region R2 are measured. As a result of measurement, in the comparative example 3, the film thickness decrement D1 and the film thickness decrement D2 are found to be 7.1 nm and 10.3 nm, respectively. Meanwhile, in the experimental example 2, the film thickness decrement D1 and the film thickness decrement D2 are found to be 4.4 nm and 4.4 nm, respectively. As can be seen from this result, in the experimental example 2 where the processing gas without containing the oxygen gas is used in the process ST1, the cutting of the second region R2 is suppressed as compared to the comparative example 3 where the processing gas containing the oxygen gas is used.

Experimental Example 3

In an experimental example 3, the method MT is performed on the same wafer as the wafer W1 used in the experimental example 1 by using the plasma processing apparatus 10 under conditions specified in Table 3. To elaborate, in a preset number of processes ST3 included in the repetition ARP in which the sequence including the process ST1 and the process ST2 and the process ST3 are repeatedly performed, a processing gas containing a NF$_3$ gas and an Ar gas is used, and a processing gas containing only the NF$_3$ gas is used in a predetermined number of processes ST3 included in the repetition ARP. Further, in all of the processes in the experimental example 3, the high frequency bias power is set to be 0 W.

TABLE 3

|  | Order of execution | Number of executions of sequence | Process | C$_4$F$_6$ Flow rate (sccm) | Ar gas flow rate (sccm) | O$_2$ gas flow rate (sccm) | NF$_3$ gas flow rate (sccm) | Pressure (mTorr) | High frequency power Frequency (MHz) | Power (W) | Processing time (sec) |
|---|---|---|---|---|---|---|---|---|---|---|---|
| Experimental example 3 | 1 | 30 | ST1 | 10 | 1000 | 0 | 0 | 20 | 40 | 100 | 5 |
|  |  |  | ST2 | 0 | 100 | 0 | 0 | 20 | 40 | 300 | 5 |
|  | 2 | — | ST3 | 0 | 480 | 0 | 20 | 60 | 40 | 300 | 5 |
|  | 3 | 20 | ST1 | 10 | 1000 | 0 | 0 | 20 | 40 | 100 | 5 |
|  |  |  | ST2 | 0 | 1000 | 0 | 0 | 20 | 40 | 300 | 5 |
|  | 4 | — | ST3 | 0 | 480 | 0 | 20 | 60 | 40 | 300 | 5 |
|  | 5 | 10 | ST1 | 10 | 1000 | 0 | 0 | 20 | 40 | 100 | 5 |
|  |  |  | ST2 | 0 | 1000 | 0 | 0 | 20 | 40 | 300 | 5 |
|  | 6 | — | ST3 | 0 | 0 | 0 | 50 | 60 | 40 | 300 | 5 |
|  | 7 | 10 | ST1 | 10 | 1000 | 0 | 0 | 20 | 40 | 100 | 5 |
|  |  |  | ST2 | 0 | 1000 | 0 | 0 | 20 | 40 | 300 | 5 |
|  | 8 | — | ST3 | 0 | 480 | 0 | 20 | 60 | 40 | 300 | 5 |
|  | 9 | 10 | ST1 | 10 | 1000 | 0 | 0 | 20 | 40 | 100 | 5 |
|  |  |  | ST2 | 0 | 1000 | 0 | 0 | 20 | 40 | 300 | 5 |
|  | 10 | — | ST3 | 0 | 0 | 0 | 50 | 60 | 40 | 300 | 5 |
|  | 11 | 10 | ST1 | 10 | 1000 | 0 | 0 | 20 | 40 | 100 | 5 |
|  |  |  | ST2 | 0 | 1000 | 0 | 0 | 20 | 40 | 300 |  |
|  | 12 | — | ST3 | 0 | 480 | 0 | 20 | 60 | 40 | 300 | 5 |
|  | 13 | 10 | ST1 | 10 | 1000 | 0 | 0 | 20 | 40 | 100 | 5 |
|  |  |  | ST2 | 0 | 1000 | 0 | 0 | 20 | 40 | 300 | 5 |
|  | 14 | — | ST3 | 0 | 0 | 0 | 50 | 60 | 40 | 300 | 5 |
|  | 15 | 10 | ST1 | 10 | 1000 | 0 | 0 | 20 | 40 | 100 | 5 |
|  |  |  | ST2 | 0 | 1000 | 0 | 0 | 20 | 40 | 300 | 5 |

As in the experimental example 1, the width WB is measured. As a result of measurement, the width WB is found to be 25 nm in the experimental example 3. As can be seen from this result, in the experimental example 3 using the processing gas containing only the NF$_3$ gas in a preset number of processes ST3 included in the repetition ARP, it is possible to enlarge the width of the deep portion of the opening, as compared to the experimental example 1.

Experimental Example 4

Figure 10A:
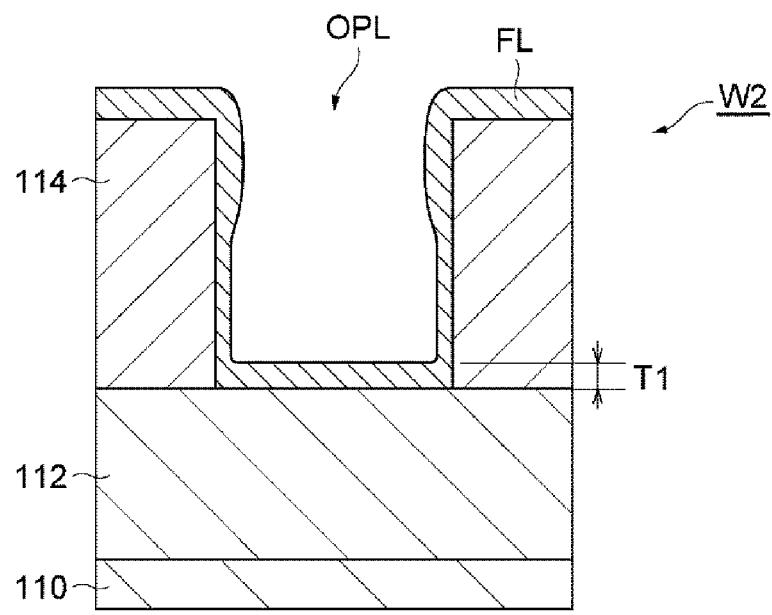
FIG. 10A and FIG. 10B are cross sectional views illustrating a wafer used in an experimental example 4.
Figure 10B:
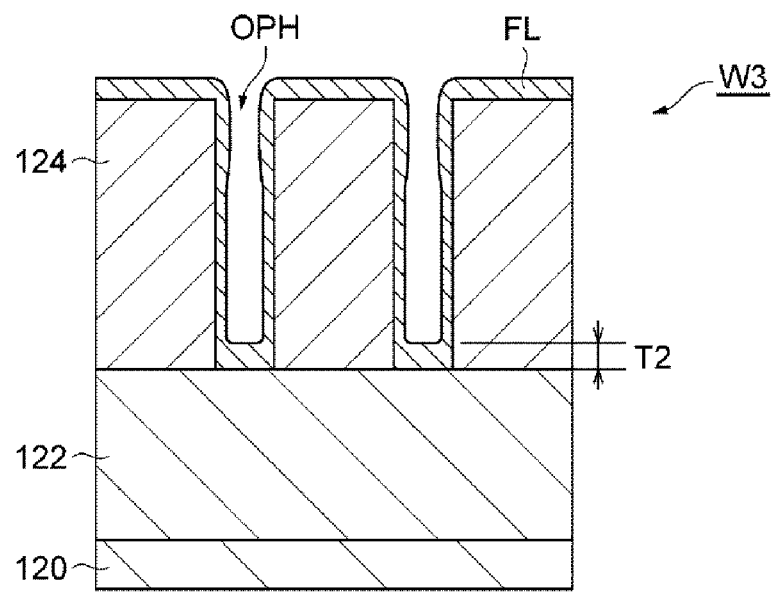

In an experimental example 4, a wafer W2 shown in FIG. 10A and a wafer W3 shown in FIG. 10B are prepared. The wafer W2 has a silicon oxide film 112, which has a thickness of 250 nm, on a substrate 110 and a mask 114, which is made of amorphous carbon, on the silicon oxide film 112. Further, an opening OPL, which is continuous to the mask opening of the mask 114 and has a low aspect ratio, is previously formed in the silicon oxide film 112 of the wafer W2. The opening OPL has a width of 250 nm and a depth of 250 nm. The wafer W3 has a silicon oxide film 122, which has a thickness of 200 nm, on a substrate 120 and a mask 124, which is made of amorphous carbon, on the silicon oxide film 122. Further, an opening OPH, which is continuous to the mask opening of the mask 124 and has a high aspect ratio, is previously formed in the silicon oxide film 122 of the wafer W3. The opening OPH has a width of 40 nm and the opening OPH has a depth of 250 nm. In the experimental example 4, a processing under conditions as specified in Table 4 is performed on the wafer W2 and the wafer W3 in the plasma processing apparatus 10. To elaborate, plasma of a processing gas containing a fluorocarbon gas and not containing an oxygen gas is generated by using the high frequency power for plasma generation of 100 W under the pressure of 15 mTorr (that is, under a low pressure equal to or less than 20 mTorr), and a fluorocarbon-containing film FL is formed. For comparison, a processing of a comparative example 4 and a processing of a comparative example 5 shown in Table 4 are performed on the wafer W2 and the wafer W3 in the plasma processing apparatus 10. In the comparative example 4, the plasma of the same processing gas as that of the experimental example 4 is generated by using the relatively high frequency power of 300 W under the pressure of 30 mTorr higher than 20 mTorr, and a fluorocarbon-containing film FL is formed. Further, in the comparative example 5, the plasma of the same processing gas as that of the experimental example 4 is generated under the pressure of 15 mTorr (that is, under a low pressure equal to or less than 20 mTorr), and a fluorocarbon-containing film FL is formed. In the comparative example 5, however, the corresponding plasma is generated by using the high frequency power of 300 W. In all of the processes of the experimental example 4, the comparative example 4 and the comparative example 5, the high frequency bias power is set to be 0 W.

TABLE 4

|  | $C_4F_6$ Flow rate (sccm) | Ar gas Flow rate (sccm) | Pressure (mTorr) | High frequency power Frequency (MHz) | Power (W) | Processing time (sec) |
| --- | --- | --- | --- | --- | --- | --- |
| Experimental example 4 | 5 | 1000 | 15 | 40 | 100 | 180 |
| Comparative example 4 | 5 | 1000 | 30 | 40 | 300 | 180 |
| Comparative example 5 | 5 | 1000 | 15 | 40 | 300 | 180 |

A film thickness T1 of the fluorocarbon-containing film FL formed at a deep portion of the opening OPL of the wafer W2 and a film thickness T2 of the fluorocarbon-containing film FL formed at a deep portion of the opening OPH of the wafer W3 are measured. As a result of measurement, in the comparative example 4, the film thickness T1 and the film thickness T2 are found to be 44 nm and 21 nm, respectively. In the comparative example 5, though the film thickness T1 is found to be 31 nm, the silicon oxide film 122 is etched at the deep portion of the opening OPH, and no fluorocarbon-containing film is formed thereon. Further, in the experimental example 4, the film thickness T1 and the film thickness T2 are found to be 25 nm and 17 nm, respectively. As clearly seen from the comparison of the film thicknesses T1 and T2 of the experimental example 4 with the film thicknesses T1 and T2 of the comparative example 4, by generating the plasma under the low pressure equal to or less than 20 mTorr (2.666 Pa), it is possible to reduce the difference in the film thickness of the fluorocarbon-containing film formed at the deep portion of the opening having the high aspect ratio and the film thickness of the fluorocarbon-containing film formed at the deep portion of the opening having the low aspect ratio. Furthermore, as clearly seen from the comparison of the film thicknesses T1 and T2 of the experimental example 4 with the film thicknesses T1 and T2 of the comparative example 5, by generating the plasma under the low pressure equal to or less than 20 mTorr (2.666 Pa) with the high frequency power of, e.g., 100 W allowing a low effective bias voltage to be generated, it is possible to form the fluorocarbon-containing film while suppressing the damage from being inflicted on the wafer.

In the above, the various exemplary embodiments have been described. However, the exemplary embodiments are not limiting, and various changes and modifications may be made. For example, in implementing the method MT, the high frequency power for plasma generation is applied to the lower electrode LE. However, the high frequency power may be supplied to the upper electrode. Further, plasma processing apparatuses other than the plasma processing apparatus 10 may be used to implement the method MT. By way of example, the method MT can be implemented in various other types of plasma processing apparatuses such as an inductively coupled plasma processing apparatus, a plasma processing apparatus configured to generate plasma with a surface wave such as microwave, and so forth.

EXPLANATION OF REFERENCE NUMERALS

10: Plasma processing apparatus
12: Processing vessel
PD: Mounting table
ESC: Electrostatic chuck
LE: Lower electrode
30: Upper electrode
34: Electrode plate
40: Gas source group
50: Gas exhaust device
62: First high frequency power supply
64: Second high frequency power supply
70: Power supply
W: Wafer
R1: First region
R2: Second region
MK: Mask
FL: Fluorocarbon-containing film

We claim:

1. A method of etching a first region containing a silicon atom and an oxygen atom selectively with respect to a second region made of a material different from the first region by performing a plasma processing on a processing target object, the processing target object including the second region in which a recess is formed, the first region which fills the recess and covers the second region, and a mask which is provided with an opening above the recess and is provided on the first region, the method comprising:
  (1) performing one or more times of a sequence each comprising:
    (1-1) forming a fluorocarbon-containing film on the processing target object by generating plasma of a first processing gas containing a fluorocarbon gas and not containing an oxygen gas such that the fluorocarbon-containing film is formed on a surface of the first region and a surface of the second region; and (1-2) etching the first region with radicals of fluorocarbon contained in the fluorocarbon-containing film by irradiating active species of atoms of a rare gas to the processing target object; and (2) reducing a film thickness of the fluorocarbon-containing film, wherein an alternating repetition in which (1) the performing of the one or more times of the sequence and (2) the reducing of the film thickness are alternately repeated is performed.

2. The method of claim 1,
wherein plasma of a second processing gas containing only a nitrogen trifluoride gas is generated in the reducing of the film thickness.

3. The method of claim 1,
wherein plasma of a third processing gas containing a nitrogen trifluoride gas and a rare gas is generated in the reducing of the film thickness.

4. The method of claim 1,
wherein plasma of a fourth processing gas containing a nitrogen trifluoride gas and a rare gas is generated in a preset number of the reducing of the film thickness included in the alternating repetition, and
plasma of a fifth processing gas containing only a nitrogen trifluoride gas is generated in a predetermined number of the reducing of the film thickness included in the alternating repetition.

5. The method of claim 1,
wherein plasma of a sixth processing gas containing only an oxygen gas is generated in the reducing of the film thickness.

6. The method of claim 1,
wherein plasma of a seventh processing gas containing an oxygen gas and a rare gas is generated in the reducing of the film thickness.

7. The method of claim 1,
wherein plasma of an eighth processing gas containing an oxygen gas and a rare gas is generated in a preset number of the reducing of the film thickness included in the alternating repetition, and
plasma of a ninth processing gas containing only an oxygen gas is generated in a predetermined number of the reducing of the film thickness included in the alternating repetition.

8. The method of claim 1,
wherein a pressure within a processing vessel in which the processing target object is accommodated is set to be equal to or less than 2.666 Pa in the forming of the fluorocarbon-containing film.

9. The method of claim 1,
wherein a high frequency power for plasma generation, which allows an effective bias voltage ranging from 100 V to 300 V to be generated, is used in the forming of the fluorocarbon-containing film.

10. The method of claim 1,
wherein, in the forming of the fluorocarbon-containing film, a capacitively coupled plasma processing apparatus is used, and a voltage for attracting positive ions is applied to a silicon-made electrode plate of an upper electrode of the plasma processing apparatus.

11. The method of claim 1,
wherein plasma of the rare gas is generated in the etching of the first region.

12. The method of claim 1,
wherein the first region is made of silicon oxide, silicon oxynitride or carbon-containing silicon oxide.

13. The method of claim 1,
wherein the second region is made of silicon, carbon, silicon nitride or a metal.

14. The method of claim 1,
wherein, in the forming of the fluorocarbon-containing film, etching of the first region progresses down to an inside of the recess formed in the second region.

15. The method of claim 1,
wherein, in the etching of the first region, a high frequency power supply is supplied to a lower electrode which is placed under the processing target object.

16. The method of claim 1,
wherein, in the forming of the fluorocarbon-containing film, a ratio of a flow rate of the fluorocarbon gas to a total flow rate of the first processing gas is set to be in a range from 0.1% to 1%.

17. The method of claim 1,
wherein, in the forming of the fluorocarbon-containing film, a high frequency power for plasma generation, modulated in a pulse shape, is provided.

18. The method of claim 1,
wherein a pressure within a processing vessel in which the processing target object is accommodated is set to be equal to or less than 4 Pa in the etching of the first region.

19. The method of claim 1,
wherein (1-2) the etching of the first region is performed without adding an additional fluorocarbon gas.

20. The method of claim 1,
wherein a nitrogen trifluoride gas is used in (2) the reducing of the film thickness, and a flow rate of the nitrogen trifluoride gas is changed depending on the number of the alternating repetitions.

* * * * *

UNITED STATES PATENT AND TRADEMARK OFFICE
CERTIFICATE OF CORRECTION

PATENT NO. : 10,090,191 B2  
APPLICATION NO. : 15/527360  
DATED : October 2, 2018  
INVENTOR(S) : Maju Tomura et al.

Page 1 of 1

It is certified that error appears in the above-identified patent and that said Letters Patent is hereby corrected as shown below:

In the Specification

Columns 17-18, Table 3, Column 5 (Ar gas flow rate), Row 2, replace "100" with -- 1000 --.

Signed and Sealed this  
Eleventh Day of December, 2018

Andrei Iancu  
*Director of the United States Patent and Trademark Office*